United States Patent
Sinanoglu (10) Patent No.: US 10,110,226 B2
(45) Date of Patent: Oct. 23, 2018

(54) ARCHITECTURE, SYSTEM, METHOD, AND COMPUTER-ACCESSIBLE MEDIUM FOR EXPEDITED-COMPACTION FOR SCAN POWER REDUCTION

(75) Inventor: Ozgur Sinanoglu, Abu Dhabi (AE)

(73) Assignee: NEW YORK UNIVERSITY, New York, NY (US)

(*) Notice: Subject to any disclaimer, the term of this patent is extended or adjusted under 35 U.S.C. 154(b) by 1394 days.

(21) Appl. No.: 13/368,963

(22) Filed: Feb. 8, 2012

(65) Prior Publication Data

US 2012/0217989 A1 Aug. 30, 2012

Related U.S. Application Data

(60) Provisional application No. 61/446,275, filed on Feb. 24, 2011.

(51) Int. Cl.
*G01R 31/28* (2006.01)
*H03K 19/00* (2006.01)

(52) U.S. Cl.
CPC ................ *H03K 19/0008* (2013.01)

(58) Field of Classification Search
CPC .... G01R 31/318536; G01R 31/318541; G01R 31/318572; G01R 31/318555; H05K 999/99
See application file for complete search history.

(56) References Cited

U.S. PATENT DOCUMENTS

| | | | |
|---|---|---|---|
| 8,205,125 B2* | 6/2012 | Hales et al. | 714/729 |
| 2003/0120988 A1* | 6/2003 | Rajski et al. | 714/726 |
| 2005/0055617 A1* | 3/2005 | Wang et al. | 714/727 |
| 2005/0138501 A1* | 6/2005 | Motika et al. | 714/724 |
| 2007/0088999 A1* | 4/2007 | Chao et al. | 714/726 |
| 2007/0143651 A1* | 6/2007 | Kiryu | 714/724 |
| 2007/0234169 A1* | 10/2007 | Rajski et al. | 714/742 |
| 2008/0141188 A1* | 6/2008 | Kapur et al. | 716/4 |
| 2008/0276141 A1* | 11/2008 | Wang et al. | 714/726 |
| 2009/0119559 A1* | 5/2009 | Foutz et al. | 714/729 |
| 2009/0210762 A1* | 8/2009 | Wang et al. | 714/729 |
| 2009/0235134 A1* | 9/2009 | Guo et al. | 714/726 |

(Continued)

OTHER PUBLICATIONS

Anshuman Chandra et al. "Low Power Illinois scan architecture for simultaneous power and test data volume reduction," in Design, Automation and Test in Europe Conference, 2008, pp. 462-467.*

(Continued)

*Primary Examiner* — Albert Decady
*Assistant Examiner* — Enamul M Kabir
(74) *Attorney, Agent, or Firm* — Hunton Andrews Kurth LLP (57) ABSTRACT

Exemplary method, computer-accessible medium, and test configuration can be provided for testing at least one flip-flop. For example, the exemplary test configuration can include at least one scan-out channel having a plurality of regions and a plurality of compactors associated with the plurality of regions. Further, exemplary method, computer-accessible medium, and test configuration can be provided for testing at least on flip-flop that in which at least one scan-out channel having a plurality of regions, a plurality of compactors, and associating the plurality of compactors with the plurality of regions can be provided.

42 Claims, 4 Drawing Sheets

Expedited-Compact (EC) – 2 regions

(56) References Cited

U.S. PATENT DOCUMENTS

| | | | |
|---|---|---|---|
| 2009/0327824 A1* | 12/2009 | Alaniz et al. | 714/732 |
| 2011/0214026 A1* | 9/2011 | Rajski et al. | 714/726 |
| 2011/0307750 A1* | 12/2011 | Narayanan et al. | 714/729 |

OTHER PUBLICATIONS

Amit Sabne et al. "A Generic Low Power Scan Chain Wrapper for Designs Using Scan Compression," in VLSI Test Symposium, 2010, pp. 135-140.*
Y. Bonhomme et al. "A gated clock scheme for low power scan testing of logic ICs or embedded cores," in Asian Test Symposium, 2001, pp. 253-258.
X. Liu et al. "A generic framework for scan capture power reduction in test compression environment," in International Test Conference, 2008, poster 20.
T. Yoshida et al. "A new approach for low power scan testing," in International Test Conference, 2003, pp. 480-487.
P. Girard et al. "Circuit partitioning for low power BIST design with minimized peak power consumption," in Asian Test Symposium, 1999, pp. 89-94.
L. Whetsel "Adapting scan architectures for low power operation," in International Test Conference, 2000, pp. 863-872.
P. Girard et al. "A modified clock scheme for a low power BIST test pattern generator," in VLSI Test Symposium, 2001, pp. 306-311.
S. Almukhaizim et al. "Dynamic scan chain partitioning for reducing peak shift power during test," IEEE Transactions on Computer-Aided Design of Integrated Circuits and Systems, vol. 28, No. 2, pp. 298-302, 2009.
A. Chandra et al. "Low power Illinois scan architecture for simultaneous power and test data volume reduction," in Design, Automation and Test in Europe Conference, 2008, pp. 462-467.
D. Czysz et al. "Low-power scan operation in test compression environment," IEEE Transactions on Computer-Aided Design of Integrated Circuits, vol. 28, No. 11, pp. 1742-1755, 2009.
C. G. Zoellin et al. "Low-Power Test Planning for Arbitrary At-Speed Delay-Test Clock Schemes," in VLSI Test Symposium, 2010, pp. 93-98.
K. M. Butler et al. "Minimizing power consumption in scan testing: Pattern generation and DFT techniques," in International Test Conference, 2004, pp. 355-364.
O. Sinanoglu et al. "Modeling scan chain modifications for scan-in test power minimization," International Test Conference, pp. 602-611, 2003.
J. Li et al. "On capture power-aware test data compression for scan-based testing," in International Conference on Computer-Aided Design, 2008.
X. Liu et al. "On simultaneous shift- and capture-power reduction in linear decompressor-based test compression environment," International Test Conference, p. 9.3, 2009.
K.-J. Lee et al. "Peak-power reduction for multiple-scan circuits during test application," in Asian Test Symposium, 2000, pp. 453-458.
M.-F. Wu et al. "Power supply noise reduction for at-speed scan testing in lineardecompression environment," IEEE Transactions on Computer-Aided Design of Integrated Circuits, vol. 28, No. 11, pp. 1767-1776, 2009.
C.-W. Tzeng et al. "QC-Fill: Quick- and cool xfilling for multicasting-based scan test," IEEE Transactions on Computer-Aided Design of Integrated Circuits, vol. 28, No. 11, pp. 1756-1763, 2009.
K. Joshi et al. "Reduction of instantaneous power by ripple scan clocking," in VLSI Test Symposium, 2005, pp. 271-276.
P. M. Rosinger et al. "Scan architecture with mutually exclusive scan segment activation for shift- and capture-power reduction," IEEE Transactions on Computer-Aided Design of Integrated Circuits and Systems, vol. 23, No. 7, pp. 1142-1153, 2004.
O. Sinanoglu et al. "Test power reduction through minimization of scan chain transitions," in VLSI Test Symposium, 2002, pp. 166-171.
J. Saxena et al. "A case study of IR-drop in structured at-speed testing," in International Test Conference, 2003, pp. 1098-1104.
X. Wen et al. "A new ATPG method for efficient capture power reduction during scan testing," in VLSI Test Symposium, 2006, pp. 58-65.
A. Chandra et al. "Bounded adjacent fill for low capture power scan testing," in VLSI Test Symposium, 2008, pp. 131-138.
R. Sankaralingam et al. "Controlling peak power during scan testing," in VLSI Test Symposium, 2002, pp. 153-159.
Y. Bonhomme et al. "Design of routing-constrained low power scan chains," in Design, Automation and Test in Europe Conference, 2004, pp. 62-67.
R. Sankaralingam et al. "Inserting test points to control peak power during scan testing," in International Symposium on Defect and Fault-Tolerance in VLSI Systems, 2002, pp. 138-146.
M.-H. Chiu et al. "Jump scan: A DFT technique for low power testing," in VLSI Test Symposium, 2005, pp. 277-282.
X. Wen et al. "Low-capture-power test generation for scan-based at-speed testing," in International Test Conference, 2005, pp. 1019-1028.
S. Bhunia et al. "Low-power scan design using first-level supply gating," IEEE Transactions on Very Large Scale Integration (VLSI) Systems, vol. 13, No. 3, pp. 384-395, 2005.
N. Nicolici et al. "Minimisation of power dissipation during test application in full scan sequential circuits using primary input freezing," in IET Computers and Digital Techniques, 2000, pp. 313-322.
S. Gerstendorfer et al. "Minimized power consumption for scan-based BIST," in International Test Conference, 1999, pp. 77-84.
X. Wen et al. "On low-capture-power test generation for scan testing," in VLSI Test Symposium, 2005, pp. 265-270.
S. Remersaro et al. "Preferred fill: A scalable method to reduce capture power for scan based designs," in International Test Conference, 2006, pp. 32.2.1-32.2.10.
R. Sankaralingam et al. "Reducing power dissipation during test using scan chain disable," in VLSI Test Symposium, 2001, pp. 319-324.
O. Sinanoglu et al. "Scan power reduction through test data transition frequency analysis," in International Test Conference, 2002, pp. 844-850.
H.-T. Lin et al. "Simultaneous capture and shift power reduction test pattern generator for scan testing," IET Computers and Digital Techniques, vol. 2, No. 2, pp. 132-141, 2008.
P. Girard "Survey of low-power testing of VLSI circuits," IEEE Design and Test, vol. 19, No. 3, pp. 82-92, 2002.
V. Dabholkar et al. "Techniques for minimizing power dissipation in scan and combinational circuits during test application," IEEE Transactions on Computer-Aided Design of Integrated Circuits and Systems, vol. 17, No. 12, pp. 1325-1333, 1998.
S. Kajihara et al. "Test vector modification for power reduction during scan testing," in VLSI Test Symposium, 2002, pp. 160-165.
Huang, Tsung-Chu et al., "An Input Control Technique for Power Reduction in Scan Circuits During Test Application," Asian Test Symposium, pp. 315-320, 1999.
Mitra, Subhasish et al., "X-Compact an Efficient Response Compaction Technique for Test Cost Reduction," IEEE International Test Conference, pp. 311-320, 2002.
Sinanoglu, Ozgur et al., "Test Power Reductions Though Computationally Efficient, Decoupled Scan Chain Modifications," IEEE Transactions on Reliability, vol. 54, No. 2, pp. 215-223, Jun. 2005.

* cited by examiner

Figure 1 (prior art) Deferred Broadcast (DB) – 4 blocks

Figure 2 Expedited-Compact (EC) – 2 regions

Figure 3 DB + EC (4 blocks, 2 regions)

ARCHITECTURE, SYSTEM, METHOD, AND COMPUTER-ACCESSIBLE MEDIUM FOR EXPEDITED-COMPACTION FOR SCAN POWER REDUCTION

CROSS-REFERENCE TO PRIOR APPLICATION(S)

This application claims priority to U.S. Provisional Application Ser. No. 61/446,275, filed on Feb. 24, 2011, which is incorporated by reference herein in its entirety.

FIELD OF THE DISCLOSURE

Exemplary embodiments of the present disclosure relate to testing of integrated circuits, and more specifically to an exemplary test architecture, system, method, and computer-readable medium for reduced power consumption for the scan testing of flip-flops.

BACKGROUND INFORMATION

Transitions embedded in between consecutive stimulus/response bits toggle scan cells during shift operations. Specifically, serial shift operations during the scan-in of stimulus and the scan-out of response bits can result in a switching activity in the scan chains, which propagate into the combinational logic, dissipating further dynamic power unnecessarily. An end-result, unless treated properly, could be an unexpected behavior of the design, thereby resulting in a yield loss, or reliability problems. Elevated levels of peak power, which can be the maximum instantaneous power throughout the entire test process, can be the cause of the former problem, while a reason for the latter problem can be rather average power that is the total power dissipation averaged over the duration of the test application process. (See, e.g., P. Girard, "Survey of low-power testing of VLSI circuits," IEEE Design and Test, vol. 19, no. 3, pp. 82-92, 2002). As the test application process can be dominated by shift operations, average power mostly depends on scan power, and thus, the impact of capture power on average power can be negligible. Capture power can be more of a concern when peak power is the targeted issue.

Various scan power reduction methodologies have been proposed. Many of these methodologies are outlined, for example, in P. Girard, "Survey of low-power testing of VLSI circuits," IEEE Design and Test, vol. 19, no. 3, pp. 82-92, 2002. The utilization of externally controlled gates or modified scan cell designs (see, e.g., S. Gerstendrfer and H.-J. Wunderlich, "Minimized power consumption for scan-based BIST," in International Test Conference, 1999, pp. 77-84; R. Sankaralingam and N. A. Touba, "Inserting test points to control peak power during scan testing," in International Symposium on Defect and Fault-Tolerance in VLSI Systems, 2002, pp. 138-146; S. Bhunia, H. Mahmoodi-Meimand, D. Ghosh, S. Mukhopadhyay, and K. Roy, "Low-power scan design using first-level supply gating," IEEE Transactions on Very Large Scale Integration (VLSI) Systems, vol. 13, no. 3, pp. 384-395, 2005; and M.-H. Chiu and J. C.-M. Li, "Jump scan: A DFT technique for low power testing," in VLSI Test Symposium, 2005, pp. 277-282) at the expense of functional performance degradation, appropriate primary input assignments during shift cycles (see, e.g., T.-C. Huang and K.-J. Lee, "An input control technique for power reduction in scan circuits during test application," in Asian Test Symposium, 1999, pp. 315-320; and N. Nicolici, B. M. Al-Hashimi, and A. C. Williams, "Minimisation of power dissipation during test application in full scan sequential circuits using primary input freezing," in IET Computers and Digital Techniques, 2000, pp. 313-322), test vector ordering and scan-latch clustering/ordering techniques (see, e.g., V. Dabholkar, S. Chakravarty, I. Pomeranz, and S. M. Reddy, "Techniques for minimizing power dissipation in scan and combinational circuits during test application," IEEE Transactions on Computer-Aided Design of Integrated Circuits and Systems, vol. 17, no. 12, pp. 1325-1333, 1998; and Y. Bonhomme, P. Girard, L. Guiller, C. Landrault, S. Pravossoudovitch, and A. Virazel, "Design of routing-constrained low power scan chains," in Design, Automation and Test in Europe Conference, 2004, pp. 62-67), modification of test cube compaction (see, e.g., R. Sankaralingam and N. A. Touba, "Controlling peak power during scan testing," in VLSI Test Symposium, 2002, pp. 153-159), test generation and don't care bit specification (see, e.g., R. Sankaralingam, N. A. Touba, and B. Pouya, "Reducing power dissipation during test using scan chain disable," in VLSI Test Symposium, 2001, pp. 319-324; S. Remersaro, X. Lin, Z. Zhang, S. M. Reddy, I. Pomeranz, and J. Rajski, "Preferred fill: A scalable method to reduce capture power for scan based designs," in International Test Conference, 2006, pp. 32.2.1-32.2.10; S. Kajihara, K. Ishida, and K. Miyase, "Test vector modification for power reduction during scan testing," in VLSI Test. Symposium, 2002, pp. 160-165; J. Saxena, K. M. Butler, V. B. Jayaram, S. Kundu, N. V. Arvind, P. Sreeprakash, and M. Hachinger, "A case study of IR-drop in structured at-speed testing," in International Test Conference, 2003, pp. 1098-1104; A. Chandra and R. Kapur, "Bounded adjacent fill for low capture power scan testing," in VLSI Test Symposium, 2008, pp. 131-138; X. Wen, Y. Yamashita, S. Kajihara, L.-T. Wang, K. K. Saluja, and K. Kinoshita, "On low-capture-power test generation for scan testing," in VLSI Test Symposium, 2005, pp. 265-270; X. Wen, Y. Yamashita, S. Morishima, S. Kajihara, L.-T. Wang, K. W. Saluja, and K. Kinoshita, "Low-capture-power test generation for scan-based at-speed testing," in International Test Conference, 2005, pp. 1019-1028; X. Wen, S. Kajihara, K. Miyase, T. Suzuki, K. W. Saluja, L.-T. Wang, K. S. Abdel-Hafez, and K. Kinoshita, "A new ATPG method for efficient capture power reduction during scan testing," in VLSI Test Symposium, 2006, pp. 58-65; and H.-T. Lin and J. C.-M. Li, "Simultaneous capture and shift power reduction test pattern generator for scan testing," IET Computers and Digital Techniques, vol. 2, no. 2, pp. 132-141, 2008), scan chain design (see, e.g., O. Sinanoglu, I. Bayraktaroglu, and A. Orailoglu, "Test power reduction through minimization of scan chain transitions," in VLSI Test Symposium, 2002, pp. 166-171; O. Sinanoglu, I. Bayraktaroglu, and A. Orailoglu, "Scan power reduction through test data transition frequency analysis," in International Test Conference, 2002, pp. 844-850; 0. Sinanoglu and A. Orailoglu, "Test power reductions through computationally efficient, decoupled scan chain modifications," IEEE Transactions on Reliability, vol. 54, no. 2, pp. 215-223, 2005; and O. Sinanoglu and A. Orailoglu, "Modeling scan chain modifications for scan-in test power minimization," International Test Conference, pp. 602-611, 2003), shift clock spreading (see, e.g., K. Joshi and E. MacDonald, "Reduction of instantaneous power by ripple scan clocking," in VLSI Test Symposium, 2005, pp. 271-276), test pattern scrubbing (see, e.g., K. M. Butler, J. Saxena, T. Fryars, and G. Hetherington, "Minimizing power consumption in scan testing: Pattern generation and DFT techniques," in International Test Conference, 2004, pp. 355-364), and scan chain segmentation via clock gating (see, e.g., T. Yoshida and M. Watari, "A new approach for low power scan testing," in International Test Conference, 2003, pp. 480-487; L. Whetsel, "Adapting scan architectures for low power operation," in International Test Conference, 2000, pp. 863-872; P. Girard, L. Guiller, C. Landrault, S. Pravossoudovitch, and H. J. Wunderlich, "A modified clock scheme for a low power BIST test pattern generator," in VLSI Test Symposium, 2001, pp. 306-311; Y. Bonhomme, P. Girard, L. Guiller, C. Landrault, and S. Pravossoudovitch, "A gated clock scheme for low power scan testing of logic ICs or embedded cores," in Asian Test Symposium, 2001, pp. 253-258; P. M. Rosinger, B. M. Al-Hashimi, and N. Nicolici, "Scan architecture with mutually exclusive scan segment activation for shift- and capture-power reduction," IEEE Transactions on Computer-Aided Design of Integrated Circuits and Systems, vol. 23, no. 7, pp. 1142-1153, 2004; K.-J. Lee, T.-C. Haung, and J.-J. Chen, "Peak-power reduction for multiple-scan circuits during test application," in Asian Test Symposium, 2000, pp. 453-458; P. Girard, L. Guiller, C. Landrault, and S. Pravossoudovitch, "Circuit partitioning for low power BIST design with minimized peak power consumption," in Asian Test Symposium, 1999, pp. 89-94; and S. Almukhaizim and O. Sinanoglu, "Dynamic scan chain partitioning for reducing peak shift power during test," IEEE Transactions on Computer-Aided Design of Integrated Circuits and Systems, vol. 28, no. 2, pp. 298-302, 2009) have been proposed to deliver savings in test power.

A variety of low-power test solutions targeted for compression-based scan architectures have also been proposed recently. For example, x-filling solutions for addressing capture power (see, e.g., J. Li, X. Liu, Y. Zhang, Y. Hu, X. Li, and Q. Xu, "On capture power-aware test data compression for scan-based testing," in International Conference on Computer-Aided Design, 2008, pp. 67-72; X. Liu and Q. Xu, "A generic framework for scan capture power reduction in test compression environment," in International Test Conference, 2008, poster 20; and M.-F. Wu, J.-L. Huang, X. Wen, and K. Miyase, "Power supply noise reduction for at-speed scan testing in lineardecompression environment," IEEE Transactions on Computer-Aided Design of Integrated Circuits, vol. 28, no. 11, pp. 1767-1776, 2009), or both shift and capture power (see, e.g., X. Liu and Q. Xu, "On simultaneous shift- and capture-power reduction in linear decompressor-based test compression environment," International Test Conference, p. 9.3, 2009), have attained reductions at the expense of an increase in pattern count. A similar end-result has been observed also with Design-for-Testability (DfT) based solutions in the form of filling some of the chains with constant 0's and disabling capture in scan chains (see, e.g., D. Czysz, M. Kassab, X. Lin, G. Mrugalski, J. Rajski, and J. Tyszer, "Low-power scan operation in test compression environment," IEEE Transactions on Computer-Aided Design of Integrated Circuits, vol. 28, no. 11, pp. 1742-1755, 2009), or by disabling the clocks of scan chains (see, e.g., C.-W. Tzeng and S.-Y. Huang, "QC-Fill: Quick- and cool xfilling for multicasting-based scan test," IEEE Transactions on Computer-Aided Design of Integrated Circuits, vol. 28, no. 11, pp. 1756-1763, 2009; and C. G. Zoellin, and H. J. Wunderlich, "Low-Power Test Planning for Arbitrary At-Speed Delay-Test Clock Schemes," in VLSI Test Symposium, 2010, pp. 93-98).

In an effort towards identifying a test power reduction solution that retains compression level intact and that does not interfere with the design flow via intrusive techniques such as clock gating, it has been indicated that the content of the scan chains during scan operations can be irrelevant and unimportant, enabling reduction of transitions in the scan chains during shift cycles. As long as the intended stimulus is delivered prior to the capture cycle and responses are compacted the same way, the quality/application of test can remain intact. Recently, a DfT-based approach (see, e.g., A. Chandra, F. Ng, and R. Kapur, "Low power Illinois scan architecture for simultaneous power and test data volume reduction," in Design, Automation and Test in Europe Conference, 2008, pp. 462-467), for reducing scan-in power in Illinois scan architecture, has been proposed to reduce test power based on this observation. In this approach, which can be referred to as the Deferred-Broadcast (DB), the broadcast stimulus is distributed from one reference chain into the other chains during the final small fragment of the shift process, thus allowing all-but-one chains to receive constant-0's for the majority of shift cycles. As a result, scan-in power can be reduced, while the intended stimulus can be delivered intact; and, this can be achieved without clock gating.

A shortcoming of the DB architecture (see, e.g., A. Chandra, F. Ng, and R. Kapur, "Low power Illinois scan architecture for simultaneous power and test data volume reduction," in Design, Automation and Test in Europe Conference, 2008, pp. 462-467) can be that it only targets scan-in power reduction and overlooks scan-out power. While each stimulus and response transition can equally contribute to switching activity during test, scan-out power typically dominates test power; stimulus don't care bits (x's) that remain post-compression can be filled properly (e.g., 0-fill or repeat-fill) to leash the scan-in power, while such a direct control over response transitions, with the exception of probabilistic and inexact simulations, does not exist. Thus, although the DB architecture (see, e.g., A. Chandra, F. Ng, and R. Kapur, "Low power Illinois scan architecture for simultaneous power and test data volume reduction," in Design, Automation and Test in Europe Conference, 2008, pp. 462-467) can attain savings in scan-in power, these savings may correspond to only a small fraction of the overall scan power.

Accordingly, there may be a need to overcome at least some of such exemplary deficiencies.

SUMMARY OF EXEMPLARY EMBODIMENTS

Exemplary embodiments of the present disclosure can provide a DfT-based architecture that can reduce average test power significantly in a cost-effective manner without resorting to any x-filling techniques. The exemplary architecture can be simple, scalable, and may retain test data and quality intact, as observed responses are the same with or without the exemplary Expedited-Compaction (EC). Furthermore, the exemplary EC can be non-intrusive for a design flow, as it does not require clock gating for power savings. The exemplary embodiment of the EC architecture according to an exemplary embodiment of the present disclosure can advance the response compaction operations, ensuring that the reference chain can hold the compacted response during the majority of shift cycles, thus enabling a constant-0 feed into the other chains. The exemplary EC architecture also can facilitate a power-area co-optimization for designs with a tight area budget. Significant reductions in test power can still be delivered at reduced area costs. Exemplary experimental results also confirm the efficacy and the cost-effectiveness of the exemplary architecture. For example, in exemplary industrial test cases, approximately 70-85% reductions in test power can be observed, which is beneficial for even larger-sized circuits.

According to another exemplary embodiment of the present disclosure, method, apparatus, computer-accessible medium and device can be provided for facilitating an expedited response compaction technique in order to reduce power dissipation during scan operations. For example, by advancing the compaction of responses, shift-out operations can be carried out in one chain for the majority of shift cycles, allowing the remaining chains to be overwritten with shifted constant-0's; yet, captured responses can be observed intact by the end of shift cycles. This exemplary DfT-based approach can be non-intrusive for design flow, can incur a minor investment in area, and can in turn deliver significant savings in test power. The exemplary approach can reduce test power without resorting to x-filling, enabling orthogonal x-filling techniques to be applied in conjunction. Exemplary experimental results can confirm the efficacy of the proposed technique in attaining test power reductions.

In another exemplary embodiment of the present disclosure, method, apparatus, computer-accessible medium and device can be provided for facilitating an Expedited-Compact (EC) testing solution, that can target scan-out power reduction. The exemplary expedited-compact can enable the collection of the compacted responses in one chain by utilizing that chain as a buffer. Overwriting of the captured response (e.g., upon its expedited compaction) in the other scan chains with shifted constant-0 values can in turn deliver reductions in scan-out power. For example, in an exemplary industrial case that can employ 0-fill so as to eliminate transitions in stimuli, the exemplary technique can be approximately 5 to approximately 66 times more effective than DB (see, e.g., A. Chandra, F. Ng, and R. Kapur, "Low power Illinois scan architecture for simultaneous power and test data volume reduction," in Design, Automation and Test in Europe Conference, 2008, pp. 462-467) in reducing average test power. Exemplary embodiments of the present disclosure can be implemented at a minor area cost, which can yield significant power savings cost-effectively. Furthermore, exemplary embodiments of the EC and the DB approach can be complementary and orthogonal, and therefore, they can be utilized in conjunction to reap both scan-in and scan-out power reduction.

Preferably, the exemplary EC approach can be utilized with any compression-based scan architecture. While such an extension has not been mentioned in (see, e.g., A. Chandra, F. Ng, and R. Kapur, "Low power Illinois scan architecture for simultaneous power and test data volume reduction," in Design, Automation and Test in Europe Conference, 2008, pp. 462-467) for the DB approach, it can also be extendable, with further area investment, for utilization with compression types other than fan-out based compression. Given the dominance of scan-out power, however, area cost to be expended for integrating DB into other compression environments may not justify the return in overall power reduction, rendering area investments in EC more favorable.

Exemplary embodiments of the present disclosure can include and/or facilitate:

Expedited-compact operations typically do not require design-flow intrusive hardware such as clock gating logic, retaining the clock tree intact, which differentiates the proposed solution from the traditional scan chain segmentation techniques (see, e.g., T. Yoshida and M. Watari, "A new approach for low power scan testing," in International Test Conference, 2003, pp. 480-487; L. Whetsel, "Adapting scan architectures for low power operation," in International Test Conference, 2000, pp. 863-872; P. Girard, L. Guiller, C. Landrault, S. Pravossoudovitch, and H. J. Wunderlich, "A modified clock scheme for a low power BIST test pattern generator," in VLSI Test Symposium, 2001, pp. 306-311; Y. Bonhomme, P. Girard, L. Guiller, C. Landrault, and S. Pravossoudovitch, "A gated clock scheme for low power scan testing of logic ICs or embedded cores," in Asian Test Symposium, 2001, pp. 253-258; P. M. Rosinger, B. M. Al-Hashimi, and N. Nicolici, "Scan architecture with mutually exclusive scan segment activation for shift- and capture-power reduction," IEEE Transactions on Computer-Aided Design of Integrated Circuits and Systems, vol. 23, no. 7, pp. 1142-1153, 2004; K.-J. Lee, T.-C. Haung, and J.-J. Chen, "Peak-power reduction for multiple-scan circuits during test application," in Asian Test Symposium, 2000, pp. 453-458; P. Girard, L. Guiller, C. Landrault, and S. Pravossoudovitch, "Circuit partitioning for low power BIST design with minimized peak power consumption," in Asian Test Symposium, 1999, pp. 89-94; and S. Almukhaizim and O. Sinanoglu, "Dynamic scan chain partitioning for reducing peak shift power during test," IEEE Transactions on Computer-Aided Design of Integrated Circuits and Systems, vol. 28, no. 2, pp. 298-302, 2009).

Expedited-compact operations typically impose no modifications on the test development process, enabling the application of a given set of test data as is.

Expedited-compact operations typically have no impact on the observed responses (identical compacted responses are observed with or without EC), rendering the test quality and test application process (time) intact.

Expedited-compact operations can enable the filling of most of the scan chains with all 0's after a small fraction of the shift operations, delivering scan-out power reductions.

Expedited-compact operations can deliver average scan power reductions between 70-85% for the industrial test cases that we have experimented with.

Expedited-compact operations can reduce power without resorting to x-filling, presenting a solution that is orthogonal to x-filling (see, e.g., R. Sankaralingam, N. A. Touba, and B. Pouya, "Reducing power dissipation during test using scan chain disable," in VLSI Test Symposium, 2001, pp. 319-324; S. Remersaro, X. Lin, Z. Zhang, S. M. Reddy, I. Pomeranz, and J. Rajski, "Preferred fill: A scalable method to reduce capture power for scan based designs," in International Test Conference, 2006, pp. 32.2.1-32.2.10; S. Kajihara, K. Ishida, and K. Miyase, "Test vector modification for power reduction during scan testing," in VLSI Test Symposium, 2002, pp. 160-165; J. Saxena, K. M. Butler, V. B. Jayaram, S. Kundu, N. V. Arvind, P. Sreeprakash, and M. Hachinger, "A case study of IR-drop in structured at-speed testing," in International Test Conference, 2003, pp. 1098-1104; and A. Chandra and R. Kapur, "Bounded adjacent fill for low capture power scan testing," in VLSI Test Symposium, 2008, pp. 131-138), and hence, can be applied in conjunction to either further boost the average power reduction levels, or preferably, pursue co-optimizations with peak shift and/or peak capture power.

Expedited-compact operations can be implemented at a projected area cost of less than 0.1% for large-sized industrial circuits. Furthermore, the inserted hardware typically has no impact on the functionality of the circuit timing-wise.

According to certain exemplary embodiments of the present disclosure, a test configuration can be provided. The exemplary test configuration can include at least one scan-out channel having a plurality of regions and a plurality of compactors associated with the plurality of regions. Each of the regions can be associated with a common clock, and a ratio of a number of the compactors to a number of the regions can be one. Further, the plurality of compactors can be identical, and each of the compactors can be associated with a respective one of the regions.

According to certain exemplary embodiments, the scan-out channel(s) can include at least one scan-chain, and the scan-chain(s) of a single region of the regions can be coupled to an input of the respective one of the compactors associated with the single region. An output of the respective one of the compactor associated with a respective one of the regions can be coupled to a reference chain of a downstream region of the regions. Additionally, the scan-chain(s) can include a reference chain and at least one shadow chain, and the test configuration can include a multiplexer is coupled to each of the reference chains and the shadow chain(s). The multiplexers coupled to the shadow chain(s) can be configured to feed at least one zero value to the shadow chain(s), which can be fed during each of a majority of shift cycles.

According to certain exemplary embodiments of the present disclosure, a method and a computer-accessible medium can be provided for testing at least one flip-flop. For example, at least one scan-out channel having a plurality of regions can be provided, a plurality of compactors can also be provided, and the plurality of compactors can be associated with the plurality of regions. The plurality of compactors can be identical, and the scan-out channel(s) can include at least one scan-chain. The scan-chain(s) of a single region of the regions can be coupled to an input of the respective one of the compactors associated with the single region, and an output of the respective compactor can be coupled to a reference chain of a downstream region of the regions. Further, the scan-chain(s) can include a reference chain and at least one shadow chain, and a multiplexer can be coupled to each of the reference chain and the shadow chain(s) of a single region of the regions.

According to certain exemplary embodiments, at least one zero can be fed to the at least one shadow chain via the multiplexers coupled to each shadow chain. The zero value(s) can be fed during each of a majority of shift cycles.

These and other objects, features and advantages of the present disclosure will become apparent upon reading the following detailed description of embodiments of the disclosure, when taken in conjunction with the appended claims.

BRIEF DESCRIPTION OF THE DRAWINGS

Further objects, features and advantages of the present disclosure will become apparent from the following detailed description taken in conjunction with the accompanying drawings showing illustrative embodiments of the present disclosure, in which.

Throughout the drawings, the same reference numerals and characters, unless otherwise stated, are used to denote like features, elements, components, or portions of the illustrated embodiments. Moreover, while the present disclosure will now be described in detail with reference to the figures, it is done so in connection with the illustrative embodiments and is not limited by the particular embodiments illustrated in the figures, or provided in the appended claims.

DETAILED DESCRIPTION OF EXEMPLARY EMBODIMENTS

Exemplary DB and EC Architectures

Exemplary embodiments of the present disclosure can provide an Expedited Compact ("EC") architecture. For simplicity of presentation, an exemplary DB architecture is described with a fanout-based compression and an exemplary EC architecture having XOR-based compaction.

Figure 1:
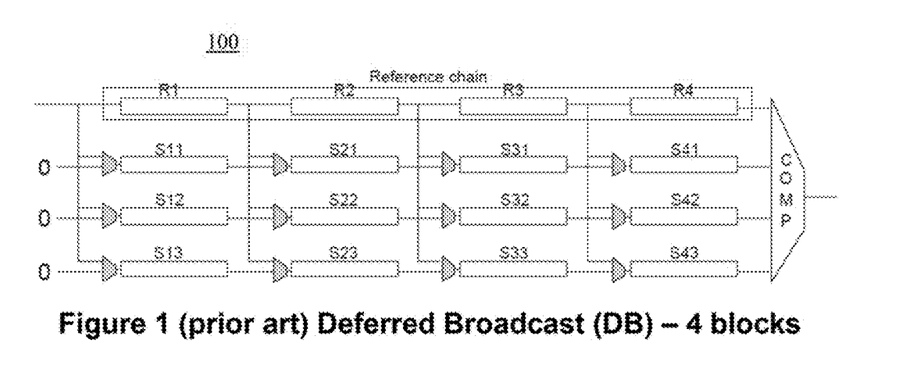
FIG. 1 is a schematic diagram of a conventional deferred-broadcast architecture.

The conventional DB architecture 100 (see, e.g., A. Chandra, F. Ng, and R. Kapur, "Low power Illinois scan architecture for simultaneous power and test data volume reduction," in Design, Automation and Test in Europe Conference, 2008, pp. 462-467) is shown in a schematic diagram of FIG. 1. As shown in FIG. 1, a single scan-in channel can fan out to four scan chains. The topmost chain in the architecture can be referred to as the reference chain (R), while the other (three) chains can be referred to as the shadow chains (S). Also, in this example, the DB architecture can decompose every scan chain into four blocks.

As the chains are decomposed into four blocks, so are the shift cycles. In the first three quadrants of the shift cycles, the broadcast stimulus is inserted into the reference chain, filling in the first three blocks of the reference chain, while the shadow chains receive constant-0 as the stimulus. In the last (fourth) quadrant of the shift cycles, the deferred broadcast operation is performed; the stimulus in $R_{i-1}$ can be broadcast into $R_i$ and $S_{1,j}$ blocks, while the scan-in channel can broadcast stimulus into $R_1$ and $S_{1,j}$ blocks. By the end of the last quadrant of shift cycles, the intended broadcast stimulus can be delivered into all the chains. In the DB architecture, a small counter-based controller is used in order to control the select lines of the multiplexers, imposing no changes in the test interface (and number of tester channels).

Power reduction in the conventional DB architecture stems from the constant-0 stimuli pumped into the shadow chains, which delivers only scan-in power reductions. As the responses are shifted out intact, however, scan-out power remains the same in the DB architecture. It can be shown that DB attains a reduction factor of $$\frac{b \cdot c}{(b + c - 1)}$$

in scan-in power, where b and c can denote the number of blocks and chains, respectively.

Figure 2:
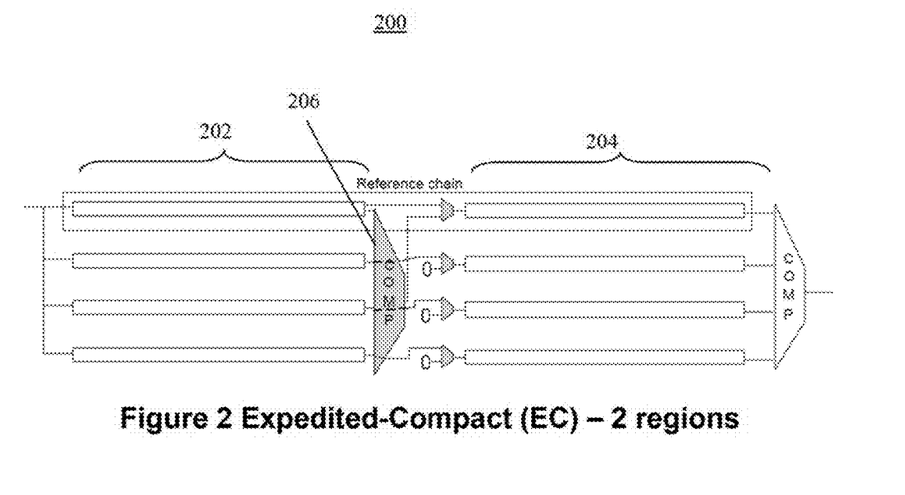
FIG. 2 is a schematic diagram of an exemplary expedited-compact architecture according to an exemplary embodiment of the present disclosure.

An exemplary EC architecture 200 in accordance with an exemplary embodiment of the present disclosure is shown in FIG. 2, for a single scan-out channel and four scan chains, e.g., each decomposed into two regions 202 and 204. The expedited compaction operation can be performed by the additional compactor (shaded color) 206 introduced in between the regions, which can feed the reference chain of the right region 204 with the compressed response of the chains of the left region 202, while the original compactor can propagate the compressed response of the rightmost region to the scan-out channel. Also in the first half of shift operations, constant-0 stimulus can feed the shadow chains of the right region 204. By the end of the first half of shift cycles, the chains in the left region 202 can include a broadcast stimulus, the reference chain in the right region 204 can include a compacted response, and the shadow chains of the right region can include 0's.

In the second half of shift cycles, e.g., constant-0 can feed into the shadow chains in the right region 204 continues, while the compacted responses in the reference chain of right region 204 can be passed to the scan-out channel. Simultaneously, the broadcast stimuli can be inserted into all the chains. In the exemplary EC architecture 200, the select lines of the multiplexers can be controlled in a similar fashion as in the DB architecture.

While the exemplary EC architecture 200 is shown to only have two regions in FIG. 2, a larger number of regions can be employed to increase the scan-out power savings, and are certainly within the scope of the present disclosure. EC with r regions can enable the filling of all the shadow chains, except for those in the leftmost region, which can be filled with 0's subsequent to one $r^{th}$ of the shift cycles, completing the collection of the compacted responses in the reference chain at this time. Thus, during the remainder of shift cycles (e.g., the last $$\frac{r-1}{r}$$

portions), the scan-out power dissipation occurs primarily in the reference chain. It can be shown that the exemplary EC configuration can attain a reduction factor of $$\frac{r \cdot c}{(r + c - 1)}$$

in scan-out power. As can be expected intuitively, the formulation hints that a larger number of regions and/or chains can yield higher savings in scan-out power.

Figure 3:
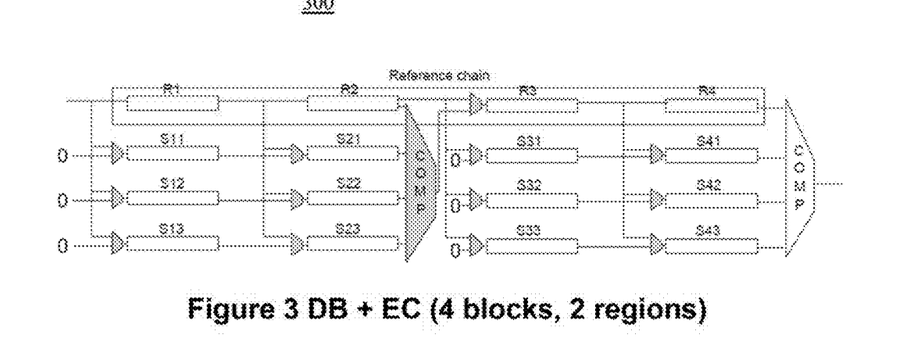
FIG. 3 is a schematic diagram of deferred-broadcast and exemplary expedited-compact architecture according to an exemplary embodiment of the present disclosure.

The exemplary DB and EC techniques can be utilized in conjunction, as illustrated in FIG. 3, to gain savings in both scan-in and scan-out power. It is noted that both DB and EC architectures can accommodate uneven block/region sizes.

As a multiplexer driven by a constant-0 can be simplified down to an AND gate, the cost of DB per scan chain can be approximately 1 AND gate and b−1 multiplexers. The cost of an exemplary EC per chain, assuming a simple XOR tree as the compactor for instance, can be approximately r−1 XOR gates and r−1 AND gates. Based on the area constraints and targeted power reduction levels, b and r can be appropriately adjusted, enabling a cost-effective trade-off between area and power; larger values for b and r can deliver larger savings in scan-in and scan-out power, respectively, yet at the expense of higher area cost.

Response compactors that include multiple XOR trees (see, e.g., S. Mitra and K. S. Kim, "X-Compact: An Efficient Response Compaction Technique for Test Cost Reduction", in IEEE International Test Conference, pp. 311-320, 2002) feeding multiple scan-out channels are commonly used, for example, in order to cope with response x's. Such compactors typically necessitate a slight modification in the exemplary EC architecture; since the number of reference chains is preferably the same as the number of scan-out channels. While a replication of these compactors can be more costly compared to replicating a simple XOR tree, significant power reductions can still be attained cost-effectively by properly adjusting the number of regions.

Exemplary Experimental Results

Exemplary experimental results of an exemplary experiment implementing embodiments of the present disclosure are described below. The exemplary experiment included three sets of experiments, which included randomly generated test data, test data of ISCAS89 circuits, and industrial test data provided by Cadence.

Exemplary Setup

The underlying scan architecture (e.g., base case) assumed in the exemplary experiments includes a single scan-in channel fanning out to a number of scan chains, which can drive a single scan-out channel through an XOR tree. The DB architecture, always with 12 blocks, and the exemplary EC architecture with varying number of regions are evaluated; although DB targets primarily scan-in power reductions and EC targets primarily scan-out power reductions, percentage reductions in overall scan power are reported for both approaches. The utilization of both DB and EC together can help attain a power reduction that equals the sum of the reductions attained by these techniques individually.

In the first set of exemplary experiments, test stimuli can be generated randomly based on a given don't care bit probability, and responses on a given 0-bit probability (fully specified response vectors are generated). The probability of generating a 0-bit and a 1-bit in the stimulus can be presumed identical. When a partially specified test stimulus is generated, it can be checked for encodability. If the stimulus can be encodable, some of its x's are specified as dictated by the encodability requirements. The remaining x's can be specified based on a given x-fill option, which can be repeat-fill, 0-fill or random-fill. Test power computations are effected for 100 encodable patterns.

In the second set of exemplary experiments, ATALANTA can be utilized to generate a test cube for a given ISCAS89 benchmark circuit. Encodability check, x-specification for ensuring encodability, and filling of the remaining x's based on a given x-fill option can be all conducted similarly as in the first set of exemplary experiments. In the second set of experiments, however, response of the benchmark circuit can be obtained via the execution of a fault simulator, HOPE. Test power computations can be effected for all the encodable test cubes.

In the third set of exemplary experiments, industrial test data provided from Cadence can be utilized. The data can include 100 fully specified (0-filled) broadcast stimulus patterns and their responses for three industrial designs. Test power computations can be effected for all 100 patterns for each of the three designs.

Exemplary Randomly Generated Test Data

Table 1 shows the average power reduction results obtained in the exemplary case of randomly generated test data. Columns 1 through 5 denote the number of chains, scan depth, x-fill option, probability of a don't care bit in the randomly generated stimulus, and probability of a 0-bit in the randomly generated response, respectively. Column 6 reports the average power reductions delivered by the DB architecture, while the remaining columns denote average power reductions attained by the proposed EC architecture, where the number of regions is increased from left to right.

TABLE 1

Average scan power reductions (%) with randomly generated responses.

| c | depth | x-fill | $P_x$ (slim) | $P_O$ (resp) | DB (b = 12) [41] | EC (r = 2) | EC (r = 3) | EC (r = 4) | EC (r = 6) | EC (r = 12) |
|---|---|---|---|---|---|---|---|---|---|---|
| 4 | 480 | repeat | 0.98 | 0.6 | 4.3 | 34.0 | 45.3 | 51.0 | 56.6 | 62.4 |
| 8 | 480 | repeat | 0.98 | 0.6 | 9.8 | 37.8 | 50.4 | 56.6 | 63.0 | 69.3 |
| 4 | 480 | repeat | 0.98 | 0.7 | 5.1 | 31.8 | 42.2 | 47.6 | 52.8 | 58.1 |
| 8 | 480 | repeat | 0.98 | 0.7 | 11.2 | 36.0 | 48.1 | 54.0 | 60.1 | 66.1 |
| 4 | 480 | repeat | 0.97 | 0.7 | 7.6 | 30.3 | 40.4 | 45.5 | 50.5 | 55.6 |
| 8 | 480 | repeat | 0.97 | 0.7 | 15.3 | 33.9 | 45.2 | 50.8 | 56.5 | 62.1 |
| 4 | 480 | repeat | 0.95 | 0.5 | 9.2 | 32.1 | 42.8 | 48.2 | 53.6 | 59.0 |
| 8 | 480 | repeat | 0.95 | 0.5 | 17.4 | 34.1 | 45.6 | 51.1 | 56.9 | 62.5 |
| 4 | 960 | repeat | 0.98 | 0.6 | 4.7 | 34.0 | 45.3 | 51.0 | 56.6 | 62.3 |
| 8 | 960 | repeat | 0.98 | 0.6 | 9.8 | 37.8 | 50.5 | 56.7 | 63.1 | 69.4 |
| 4 | 480 | 0-fill | 0.98 | 0.6 | 8.7 | 31.8 | 42.4 | 47.7 | 53.0 | 58.3 |
| 8 | 480 | 0-fill | 0.98 | 0.6 | 17.0 | 34.1 | 45.4 | 51.0 | 56.8 | 62.5 |
| 4 | 480 | random | 0.98 | 0.6 | 35.3 | 17.7 | 23.7 | 26.6 | 29.5 | 32.5 |
| 8 | 480 | random | 0.98 | 0.6 | 41.6 | 20.7 | 27.7 | 31.1 | 34.6 | 38.0 |

The following can be observed:

With more aggressive compression ratios (higher degree of fan-out, and thus, more chains), higher reductions in average power can be delivered by instances of the proposed EC architecture, consistent with the power reduction ratio $$\frac{r \cdot c}{(r + c - 1)}.$$

With higher don't care bit probabilities and/or with 0-bit probabilities in responses closer to 0.5, more x's can remain in stimuli after compression and more transitions can exist in responses. As the repeat-fill or 0-fill options can reduce transitions in stimuli, scan-out power can become the dominant factor in overall scan power. The DB architecture, even with 12 blocks, can fail to deliver reasonable power reductions, while the exemplary EC architectures with a larger number of regions can deliver very high and consistent reductions. The variation in effectiveness among exemplary EC versions with different numbers of regions becomes higher.

Scan depth can have a minor impact on power reductions.

More efficient x-fill options (e.g., 0-fill and repeat-fill) can lead to fewer transitions in stimuli, and thus to lower scan-in power. The end-result can be more dominant-scan-out power, rendering DB ineffective and variation in effectiveness for exemplary EC versions higher.

In the case of random-fill, DB with 12 blocks and EC with 12 regions can deliver similar savings in overall scan power reduction.

With the exception of the random-fill option, which is typically not employed in any case, DB can deliver less than approximately 20% scan power reductions, EC with only three regions can deliver approximately 40-50% scan power reductions, and EC with maximal number of regions can deliver approximately 55-70% scan power reductions.

Exemplary Results on ISCAS89 Benchmark Circuits

Table 2 provides the average power reduction results as well as area cost in the exemplary case of ISCAS89 benchmark circuits. Columns 1 through 3 denote the circuit name, number of chains, and the x-fill option for stimuli, respectively. Columns 4 through 9 denote average power reductions attained by the DB and the proposed EC architectures, where the number of regions for EC is varied.

TABLE 2

Average scan power reductions (%) (@ area cost) for ISCAS89 circuits.

| Circuit | c | x-fill | DB (b = 12) [41] | EC (r = 2) | EC (r = 3) | EC (r = 4) | EC (r = 6) | EC (r = 12) |
|---|---|---|---|---|---|---|---|---|
| s35932 | 4 | repeat | 1.5 (@0.1%) | 36.7 (@<0.1%) | 50.2 (@<0.1%) | 54.2 (@0.1%) | 61.4 (@0.1%) | 66.7 (@0.3%) |
| s35932 | 8 | repeat | 0.4 (@0.2%) | 38.1 (@0.1%) | 54.2 (@0.1%) | 59.6 (@0.2%) | 65.3 (@0.4%) | 71.6 (@0.8%) |
| s35932 | 4 | 0-fill | 5.5 | 35.7 | 48.4 | 52.2 | 59.0 | 64.1 |
| s35932 | 8 | 0-fill | 10.0 | 34.4 | 48.8 | 53.5 | 58.9 | 64.3 |
| s35932 | 4 | random | 35.9 | 18.6 | 24.4 | 27.6 | 30.7 | 33.7 |
| s35932 | 8 | random | 41.4 | 21.1 | 28.7 | 32.0 | 35.5 | 39.1 |
| s38417 | 4 | repeat | 7.6 (@0.1%) | 19.6 (@<0.1%) | 27.9 (@<0.1%) | 30.8 (@0.1%) | 35.0 (@0.1%) | 38.2 (@0.3%) |
| s38417 | 8 | repeat | −0.6 (@0.2%) | 34.2 (@0.1%) | 48.1 (@0.1%) | 53.3 (@0.2%) | 59.5 (@0.4%) | 65.5 (@0.8%) |
| s38417 | 4 | 0-fill | 19.9 | 24.7 | 33.1 | 36.0 | 39.6 | 43.1 |
| s38417 | 8 | 0-fill | 9.1 | 36.7 | 51.0 | 56.1 | 61.7 | 67.1 |
| s38417 | 4 | random | 36.2 | 16.1 | 21.3 | 24.7 | 27.2 | 30.1 |
| s38417 | 8 | random | 39.7 | 20.8 | 27.7 | 31.0 | 35.1 | 38.8 |
| s38584 | 4 | repeat | 10.7 (@0.1%) | 22.3 (@<0.1%) | 28.7 (@<0.1%) | 32.2 (@0.1%) | 36.0 (@0.1%) | 39.3 (@0.3%) |
| s38584 | 8 | repeat | 15.0 (@0.2%) | 26.7 (@0.1%) | 38.6 (@0.1%) | 41.9 (@0.2%) | 46.9 (@0.3%) | 51.9 (@0.8%) |
| s38584 | 4 | 0-fill | 18.3 | 17.7 | 23.8 | 25.0 | 29.6 | 31.7 |
| s38584 | 8 | 0-fill | 24.8 | 22.1 | 32.5 | 35.1 | 39.5 | 43.7 |
| s38584 | 4 | random | 34.8 | 18.8 | 25.1 | 28.2 | 31.3 | 34.4 |
| s38584 | 8 | random | 40.3 | 21.3 | 28.3 | 31.9 | 35.4 | 38.9 |

The following can be observed:

With more aggressive compression ratios (e.g., larger number of chains), higher reductions in average power can be delivered by instances of the EC architecture.

More efficient x-fill options can lead to fewer transitions in stimuli, and thus to lower scan-in power. The end-result can be more dominant scan-out power, rendering DB ineffective and variation in effectiveness for EC higher for different numbers of regions.

With the exception of the random-fill option, on average, DB can deliver approximately a 10% reduction at approximately 0.1% area cost, EC with only three regions can deliver approximately a 40% reduction at approximately 0.1% area cost, and EC with maximal number of regions can deliver approximately a 55% reduction at approximately 0.6% average area cost.

Exemplary Results on Industrial Test Data

Figure 4:
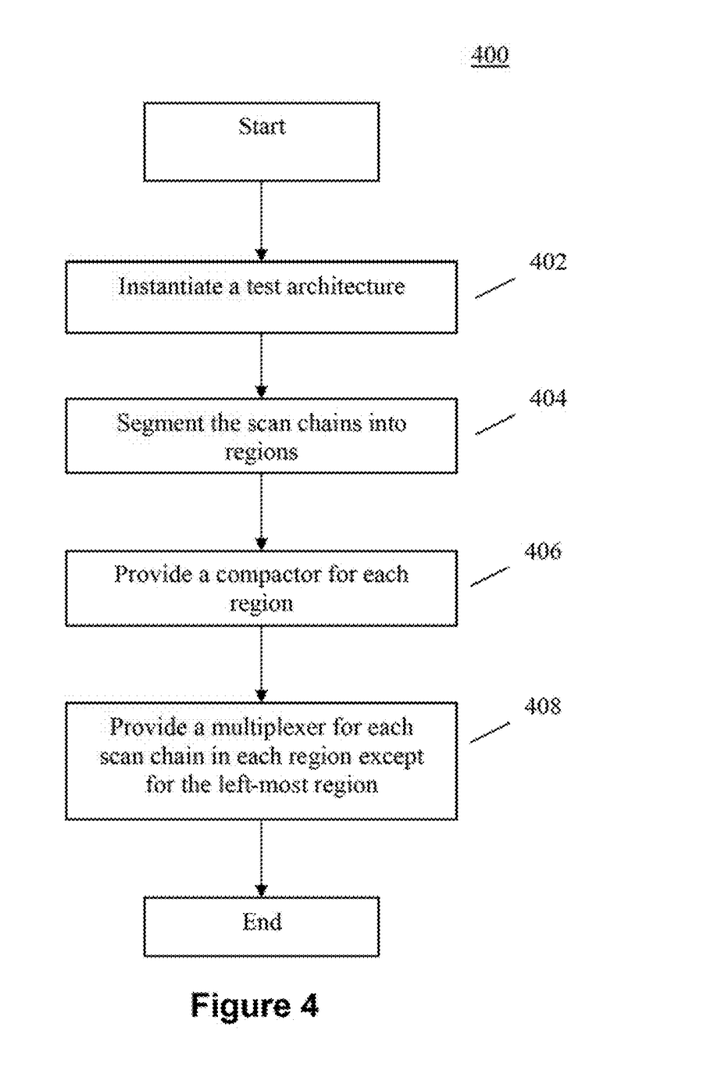
FIG. 4 is a flow diagram of an exemplary embodiment of a method according to the present disclosure.

Table 3 provides the average power reduction results with the exemplary EC technique applied on test data of three industrial designs. Columns 1 through 3 denote the circuit name, number of scan cells, and number of chains, respectively. Columns 4 through 9 denote average power reductions and per-chain area cost of the DB and the proposed EC architectures, where the number of regions is varied.

and/or separate each scan chain into r sub-chains, where one sub-chain of each chain that are of the substantially same distance to the scan-in channels form a region (procedure 404). The sub-chain output can be connected to one compactor instance, and the sub-chains within the same region can feed distinct inputs of the same compactor instance (procedure 406). The tool can also insert a multiplexer for each sub-chain (408), except for those in the region closest to the scan-in channels; the inserted multiplexer output can be connected to the input of the sub-chain.

The exemplary product/tool/script can select m of the s chains as the reference chains. A D1 (data-1) input of the multiplexer connected to a sub-chain of the reference chains can be connected to one output of the compactor, which can be fed by the sub-chains of the preceding region. There can be a one-to-one mapping from the m compactor outputs to m multiplexers of the sub-chains of the reference chains in a region. The D1 input of the multiplexer connected to the sub-chains of the other (non-reference) chains can be connected to constant-0 (or alternatively to constant-1).

The exemplary product/tool/script can connect the D0 input of the multiplexers of the sub-chains to the output of the sub-chain of the same chain in the previous region. The select lines of the inserted multiplexers can be connected to

TABLE 3

Average scan power reductions (%) and per-chain area cost for industrial circuits.

| Circuit | #Bits | c | DB (r = 12) [41] | EC (r = 2) | EC (r = 3) | EC (r = 4) | EC (r = 6) | EC (r = 12) |
|---|---|---|---|---|---|---|---|---|
| A | 15,669 | 10 | 14.1 (11MOX + 1AND) | 36.5 (1XOR + 1AND) | 48.3 (2XOR + 2AND) | 54.7 (3XOR + 3AND) | 60.7 (5XOR + 5AND) | 66.9 (11XOR + 11AND) |
| B | 22,213 | 20 | 15.7 (11MOX + 1AND) | 38.7 (1XOR + 1AND) | 51.3 (2XOR + 2AND) | 57.9 (3XOR + 3AND) | 64.4 (5XOR + 5AND) | 70.8 (11XOR + 11AND) |
| C | 61,298 | 30 | 1.3 (11MOX + 1AND) | 47.1 (1XOR + 1AND) | 62.9 (2XOR + 2AND) | 70.6 (3XOR + 3AND) | 78.4 (5XOR + 5AND) | 86.2 (11XOR + 11AND) |

The exemplary results can indicate that the variation in reductions attained by different EC versions (e.g., different number of regions) can increase as the size of the circuit increases. For the largest circuit C, for instance, DB can deliver almost no reduction, while the full capacity 12-region EC can deliver a reduction close to approximately 90%. On the other extremal point, the proposed EC can deliver approximately 35%-50% reductions in scan power for these designs with only a single replication of the compactor (e.g., 2 regions) cost-effectively. In between these two extremal points, the cost-effective 3-region EC can deliver approximately 45-65% reductions; for design C that has 61K registers, a 3-region EC with an area cost of 2 XOR gates+2 AND gates per scan chain, with each chain having more than 2K scan cells, can deliver a power reduction of approximately 63%.

According to another exemplary embodiment of the present disclosure, a software product/tool/script can be provided that can implement the exemplary EC in a particular design. An exemplary procedure that can be carried out by the software product/tool/script is shown in FIG. 4. For example, as shown in FIG. 4, the exemplary product/tool/script can accept a scan-inserted design netlist and the number of regions r, and instantiate (r−1) copies of the s by m (s-input and m-output) response compactor, creating a total of r compactors, including the original compactor (procedure 402). The product/tool/script can also break the output of a controller block, which can also be instantiated and inserted by the tool.

Accordingly, the exemplary product/tool/script can produce a new netlist with the EC logic inserted into the scan architecture.

Figure 5:
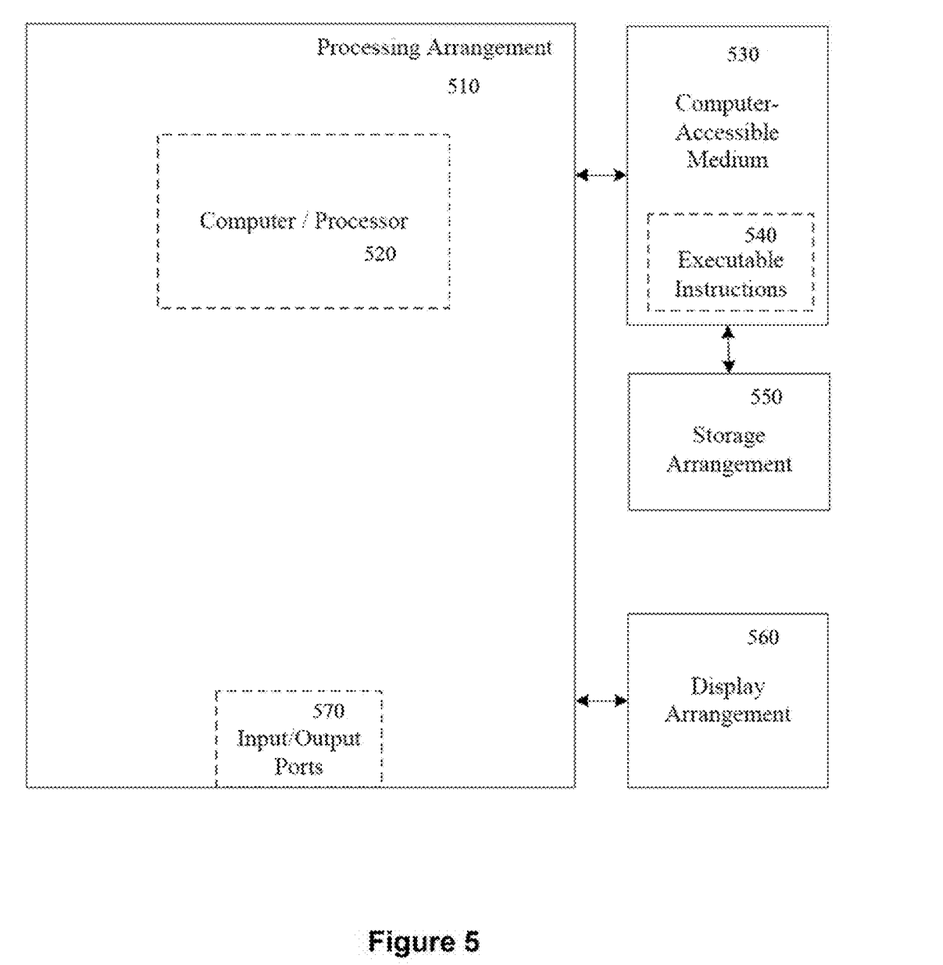
FIG. 5 is a block diagram of an apparatus according to a further exemplary embodiment of the present disclosure.

FIG. 5 shows an exemplary block diagram of an exemplary embodiment of a system according to the present disclosure. For example, the exemplary tool and/or procedures in accordance with the present disclosure described herein can be performed by a processing arrangement and/or a computing arrangement 510. Such processing/computing arrangement 510 can be, e.g., entirely or a part of, or include, but not limited to, a computer/processor 520 that can include, e.g., one or more microprocessors, and use instructions stored on a computer-accessible medium (e.g., RAM, ROM, hard drive, or other storage device).

As shown in FIG. 5, e.g., a computer-accessible medium 530 (e.g., as described herein above, a storage device such as a hard disk, floppy disk, memory stick, CD-ROM, RAM, ROM, etc., or a collection thereof) can be provided (e.g., in communication with the processing arrangement 510). The computer-accessible medium 530 can contain executable instructions 540 thereon. In addition or alternatively, a storage arrangement 550 can be provided separately from the computer-accessible medium 530, which can provide the instructions to the processing arrangement 510 so as to configure the processing arrangement to execute certain exemplary procedures, processes and methods, as described herein above, for example.

Further, the exemplary processing arrangement 510 can be provided with or include an input/output arrangement 570, which can include, e.g., a wired network, a wireless network, the internet, an intranet, a data collection probe, a sensor, etc. As shown in FIG. 5, the exemplary processing arrangement 510 can be in communication with an exemplary display arrangement 560, which, according to certain exemplary embodiments of the present disclosure, can be a touch-screen configured for inputting information to the processing arrangement in addition to outputting information from the processing arrangement, for example. Further, the exemplary display 560 and/or a storage arrangement 550 can be used to display and/or store data in a user-accessible format and/or user-readable format.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements, and procedures which, although not explicitly shown or described herein, embody the principles of the disclosure and can be thus within the spirit and scope of the disclosure. In addition, all publications and references referred to above can be incorporated herein by reference in their entireties. It should be understood that the exemplary procedures described herein can be stored on any computer accessible medium, including a hard drive, RAM, ROM, removable disks, CD-ROM, memory sticks, etc., and executed by a processing arrangement and/or computing arrangement which can be and/or include a hardware processors, microprocessor, mini, macro, mainframe, etc., including a plurality and/or combination thereof. In addition, certain terms used in the present disclosure, including the specification, drawings and claims thereof, can be used synonymously in certain instances, including, but not limited to, e.g., data and information. It should be understood that, while these words, and/or other words that can be synonymous to one another, can be used synonymously herein, that there can be instances when such words can be intended to not be used synonymously. Further, to the extent that the prior art knowledge has not been explicitly incorporated by reference herein above, it can be explicitly being incorporated herein in its entirety. All publications referenced can be incorporated herein by reference in their entireties.

What is claimed is:

1. A test configuration, comprising:
   at least one scan-out channel having a plurality of regions, wherein the at least one scan-out channel includes at least one scan chain; and
   a plurality of identical compactors associated with the plurality of regions,
   wherein, during a first number of shift cycles, (i) all identical compactors are configured to be operated to finalize compaction of responses in a reference chain, and (ii) the at least one scan chain has all zero values; and
   wherein, during a second number of shift cycles, all identical compactors are configured to idle.

2. The test configuration of claim 1, wherein each of the compactors is associated with a respective one of the regions.

3. The test configuration of claim 1, wherein the first number of shift cycles is based on a ratio of a scan depth to a number of the identical compactors.

4. The test configuration of claim 1, wherein the at least one scan-chain of a single region of the regions is coupled to an input of the respective one of the identical compactors associated with the single region.

5. The test configuration of claim 1, wherein the at least one scan-chain includes the reference chain and at least one shadow chain.

6. The test configuration of claim 5, further comprising a multiplexer which is coupled to each of the reference chains and the at least one shadow chain.

7. The test configuration of claim 6, wherein the multiplexers coupled to the at least one shadow chain are configured to feed the zero values to the at least one shadow chain.

8. The test configuration of claim 1, wherein the second number of shift cycles is based on a scan depth minus a ratio of the scan depth to a number of the identical compactor.

9. The test configuration of claim 1, wherein each of the regions includes a group of consecutive scan slices, and wherein at least one of the scan slices includes one cell from each scan chain that is equal distance to the at least one scan-out channel.

10. The test configuration of claim 1, wherein a ratio of a number of the identical compactors to a number of the regions is one.

11. The test configuration of claim 4, wherein an output of the respective one of the identical compactors associated with a respective one of the regions is coupled to the reference chain of a downstream region of the regions.

12. A method for testing at least one flip-flop, comprising:
    providing at least one scan-out channel having a plurality of regions, wherein the at least one scan-out channel includes at least one scan chain;
    providing a plurality of identical compactors;
    associating the plurality of identical compactors with the plurality of regions;
    during a first number of shift cycles, (i) operating all identical compactors to finalize compaction of responses in a reference chain, and (ii) feeding all zero values to the at least one scan chain; and
    during a second number of shift cycles, idling all identical compactors.

13. The method of claim 12, wherein the first number of shift cycles is based on a ratio of a scan depth to a number of the identical compactors.

14. The method of claim 12, wherein the at least one scan-chain includes the reference chain and at least one shadow chain.

15. The method of claim 14, further comprising coupling a multiplexer to each of the reference chains and the at least one shadow chain of a single region of the regions.

16. The method of claim 15, further comprising feeding the zero values to the at least one shadow chain via the multiplexers coupled to each shadow chain.

17. The method of claim 12, wherein the second number of shift cycles is based on a scan depth minus a ratio of the scan depth to a number of the identical compactors.

18. The method of claim 14, wherein the at least one scan-chain of a single region of the regions is coupled to an input of the respective one of the identical compactors associated with the single region, and an output of the respective identical compactor is coupled to the reference chain of a downstream region of the regions.

19. A non-transitory computer readable medium including instructions thereon that are accessible by a hardware processing arrangement, wherein, when the processing arrangement executes the instructions, the processing arrangement is configured to:

provide at least one scan-out channel having a plurality of regions, wherein the at least one scan-out channel includes at least one scan chain;

provide a plurality of identical compactors;

associate the plurality of identical compactors with the plurality of regions;

during a first number of shift cycles, (i) operate all identical compactors to finalize compaction of responses in a reference chain and (ii) feed all zero values to the at least one scan chain; and during a second number of shift cycles, idle all identical compactors.

20. The non-transitory computer readable medium of claim 19, wherein the at least one scan-out channel includes the reference chain and at least one shadow chain, and the processing arrangement is further configured to provide a multiplexer for each of the at least one scan-chain.

21. The non-transitory computer readable medium of claim 20, wherein the multiplexers are configured to feed the zero values to the at least one shadow chain via the multiplexers coupled to each shadow chain.

22. The non-transitory computer readable medium of claim 19, wherein the first number of shift cycles is based on a ratio of a scan depth to a number of the identical compactors.

23. The non-transitory computer readable medium of claim 20, wherein the at least one scan-chain of a single region of the regions is input into to the respective one of the identical compactors associated with the single region, and an output of the respective identical compactor is coupled to the reference chain of a downstream region of the regions.

24. The non-transitory computer readable medium of claim 19, wherein the second number of shift cycles is based on a scan depth minus a ratio of the scan depth to a number of the identical compactors.

25. A test configuration comprising:
at least one scan-out channel having a plurality of regions, each of the regions including at least one scan cell, wherein the at least one scan-out channel includes at least one scan chain, and wherein the at least one scan-chain includes a reference chain and at least one shadow chain; and a plurality of compactors associated with the plurality of regions, wherein
the compactors comprise a first compactor and a second compactor,
the regions comprise a first region and a second region,
the first compactor is positioned between the first region and the second region,
the second compactor is positioned after the second region,
during a first number of shift cycles, (i) all compactors are configured to be operated to finalize compaction of responses in a reference chain, and (ii) the at least one scan chain has all zero values; and
during a second number of shift cycles, all compactors are configured to idle.

26. The test configuration of claim 25, wherein the first number of shift cycles is based on a ratio of a scan depth to a number of the compactors.

27. The test configuration of claim 25, further comprising a multiplexer which is coupled to the reference chain and at least one shadow chain.

28. The test configuration of claim 27, wherein the multiplexer is configured to feed the zero values to the at least one shadow chain.

29. The test configuration of claim 25, wherein the second number of shift cycles is based on a scan depth minus a ratio of the scan depth to a number of the compactors.

30. The test configuration of claim 25, wherein:
the at least one scan-chain of a single region of the regions is coupled to an input of a respective one of the compactors associated with the single region, and
an output of the respective one of the compactors associated with a respective one of the regions is coupled to the reference chain of a downstream region of the regions.

31. A method for testing at least one flip-flop, comprising:
providing at least one scan-out channel having a plurality of regions, each of the regions including at least one scan cell, wherein the at least one scan-out channel includes at least one scan chain, and wherein the at least one scan-chain includes a reference chain and at least one shadow chain;

providing a plurality of compactors associated with the plurality of regions;

during a first number of shift cycles, (i) operating all compactors to finalize compaction of responses in the reference chain, and (ii) feeding all zero values to the at least one scan chain; and during a second number of shift cycles, idling all compactors, wherein
the compactors comprise a first compactor and a second compactor,
the regions comprise a first region and a second region,
the first compactor is positioned between the first region and the second region, and
the second compactor is positioned after the second region.

32. The method of claim 31, wherein the first number of shift cycles is based on a ratio of a scan depth to a number of the compactors.

33. The method of claim 31, further comprising providing a multiplexer which is coupled to the reference chain and at least one shadow chain.

34. The method of claim 33, wherein the multiplexer is configured to feed the zero values to the at least one shadow chain.

35. The method of claim 31, wherein the second number of shift cycles is based on a scan depth minus a ratio of the scan depth to a number of the compactors.

36. The method of claim 31, wherein:
the at least one scan-chain of a single region of the regions is coupled to an input of a respective one of the compactors associated with the single region, and
an output of the respective one of the compactors associated with a respective one of the regions is coupled to the reference chain of a downstream region of the regions.

37. A non-transitory computer readable medium including instructions thereon that are accessible by a hardware processing arrangement, wherein, when the processing arrangement executes the instructions, the processing arrangement is configured to:
provide at least one scan-out channel having a plurality of regions, each of the regions including at least one scan cell, wherein the at least one scan-out channel includes at least one scan chain, and wherein the at least one scan-chain includes a reference chain and at least one shadow chain; and provide a plurality of compactors associated with the plurality of regions;

during a first number of shift cycles (i) operate all compactors to finalize compaction of responses in the reference chain and (ii) feed all zero values to the at least one scan chain; and during a second number of shift cycles, idle all compactors, wherein
the plurality of compactors comprises a first compactor and a second compactor,
the plurality of regions comprises a first region and a second region,
the first compactor is positioned between the first region and the second region, and
the second compactor is positioned after the second region.

38. The non-transitory computer readable medium of claim 37, wherein the first number of shift cycles is based on a ratio of a scan depth to a number of the compactors.

39. The non-transitory computer readable medium of claim 37, wherein the processing arrangement is further configured to provide a multiplexer which is coupled to the reference chain and at least one shadow chain.

40. The non-transitory computer readable medium of claim 37, wherein the multiplexer is configured to feed the zero values to the at least one shadow chain.

41. The non-transitory computer readable medium of claim 40, wherein the second number of shift cycles is based on a scan depth minus a ratio of the scan depth to a number of the compactors.

42. The non-transitory computer readable medium of claim 37, wherein:
the at least one scan-chain of a single region of the regions is coupled to an input of a respective one of the compactors associated with the single region, and
an output of the respective one of the compactors associated with a respective one of the regions is coupled to the reference chain of a downstream region of the regions.

* * * * *